United States Patent
Goto et al.

(10) Patent No.: US 11,722,122 B2
(45) Date of Patent: Aug. 8, 2023

(54) MULTILAYER PIEZOELECTRIC SUBSTRATE WITH HIGH DENSITY ELECTRODE

(71) Applicant: SKYWORKS SOLUTIONS, INC., Irvine, CA (US)

(72) Inventors: Rei Goto, Osaka (JP); Gong Bin Tang, Moriguchi (JP); Keiichi Maki, Suita (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 319 days.

(21) Appl. No.: 17/093,747

(22) Filed: Nov. 10, 2020

(65) Prior Publication Data
US 2021/0159886 A1   May 27, 2021

Related U.S. Application Data

(60) Provisional application No. 62/939,202, filed on Nov. 22, 2019.

(51) Int. Cl.
*H03H 9/25* (2006.01)
*H03H 9/02* (2006.01)
*H03H 9/64* (2006.01)
*H03H 9/13* (2006.01)

(52) U.S. Cl.
CPC .......... *H03H 9/25* (2013.01); *H03H 9/02574* (2013.01); *H03H 9/02842* (2013.01); *H03H 9/131* (2013.01); *H03H 9/6406* (2013.01)

(58) Field of Classification Search
CPC .. H03H 9/25; H03H 9/02574; H03H 9/02842; H03H 9/131; H03H 9/6406; H03H 9/02559; H03H 9/02834; H03H 9/14541

USPC .......................................... 333/133, 193–196
See application file for complete search history.

(56) References Cited

U.S. PATENT DOCUMENTS

| | | | |
|---|---|---|---|
| 5,646,584 A * | 7/1997 | Kondratyev | ......... H03H 9/0285 333/195 |
| 7,230,512 B1 | 6/2007 | Carpenter et al. | |
| 9,438,201 B2 | 9/2016 | Hori et al. | |
| 2014/0339957 A1 | 11/2014 | Tajima et al. | |
| 2017/0063332 A1 | 3/2017 | Gilbert et al. | |
| 2017/0214386 A1 | 7/2017 | Kido | |
| 2017/0222618 A1 | 8/2017 | Inoue et al. | |
| 2017/0250669 A1 | 8/2017 | Kuroyanagi et al. | |
| 2017/0272051 A1 | 9/2017 | Kurihara et al. | |
| 2017/0273183 A1 | 9/2017 | Kawasaki et al. | |
| 2017/0288629 A1 | 10/2017 | Bhattacharjee et al. | |
| 2017/0359048 A1 * | 12/2017 | Yasuda | .............. H03H 9/02992 |

(Continued)

*Primary Examiner* — Rakesh B Patel
*Assistant Examiner* — Jorge L Salazar, Jr.
(74) *Attorney, Agent, or Firm* — Lando & Anastasi, LLP

(57) ABSTRACT

A surface acoustic wave (SAW) resonator comprises a plurality of interdigital transducer (IDT) electrodes disposed on a multilayer piezoelectric substrate including a layer of piezoelectric material having a lower surface bonded to an upper surface of a layer of a dielectric material. The dielectric material has a lower surface bonded to an upper surface of a carrier substrate. The plurality of IDT electrodes include an upper layer and a lower layer. The upper layer is formed of a material having a higher conductivity than the lower layer. The lower layer is formed of a material having a higher density than the upper layer to provide for reduction in size of the SAW resonator.

20 Claims, 19 Drawing Sheets

(56) References Cited

U.S. PATENT DOCUMENTS

| | | |
|---|---|---|
| 2018/0013404 A1 | 1/2018 | Kawasaki et al. |
| 2018/0316329 A1 | 11/2018 | Guenard et al. |
| 2018/0367119 A1 | 12/2018 | Lee |
| 2019/0288661 A1 | 9/2019 | Akiyama et al. |
| 2020/0067482 A1 | 2/2020 | Maki et al. |
| 2020/0366270 A1* | 11/2020 | Matsuoka ......... H03H 9/02582 |
| 2021/0058057 A1 | 2/2021 | Goto et al. |
| 2022/0014175 A1* | 1/2022 | Nagatomo ......... H03H 9/02559 |
| 2022/0077840 A1 | 3/2022 | Caron |

\* cited by examiner

MULTILAYER PIEZOELECTRIC SUBSTRATE WITH HIGH DENSITY ELECTRODE

CROSS-REFERENCE TO RELATED APPLICATIONS

This application claims priority under 35 U.S.C. § 119(e) to U.S. Provisional Patent Application Ser. No. 62/939,202, titled "MULTILAYER PIEZOELECTRIC SUBSTRATE WITH HIGH DENSITY ELECTRODE," filed Nov. 22, 2019, incorporated herein by reference in its entirety for all purposes.

BACKGROUND

Technical Field

Embodiments of this disclosure relate to acoustic wave devices, structures and methods for reducing the sizes of same, and the suppression of spurious signals in same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front-end of a mobile phone can include acoustic wave filters. Two acoustic wave filters can be arranged as a duplexer.

SUMMARY

In accordance with one aspect, there is provided a surface acoustic wave (SAW) resonator. The SAW resonator comprises a plurality of interdigital transducer (IDT) electrodes disposed on a multilayer piezoelectric substrate including a layer of piezoelectric material having a lower surface bonded to an upper surface of a layer of a dielectric material, the dielectric material having a lower surface bonded to an upper surface of a carrier substrate, the plurality of IDT electrodes including an upper layer and a lower layer, the upper layer formed of a material having a higher conductivity than the lower layer, the lower layer formed of a material having a higher density than the upper layer to provide for reduction in size of the SAW resonator.

In some embodiments, the upper layer of the IDT electrodes includes aluminum.

In some embodiments, the lower layer of the IDT electrodes includes one or more of molybdenum, tungsten, copper, gold, silver, platinum, ruthenium, or iridium.

In some embodiments, the layer of piezoelectric material has a thickness of between about $0.1\lambda$ and about $1\lambda$, $\lambda$ being the wavelength of a main acoustic wave generated in the SAW resonator during operation. The layer of dielectric material may have a thickness of between about $0.01\lambda$ and about $1\lambda$. The upper layer of the plurality of IDT electrodes may have thickness of between about $0.04\lambda$ and about $0.1\lambda$. The lower layer of the plurality of IDT electrodes may have thickness of between about $0.02\lambda$ and about $0.08\lambda$.

In some embodiments, the SAW resonator further comprises a reflector electrodes disposed on each side of the IDT electrodes, the reflector electrodes including an upper layer and a lower layer, the upper layer formed of the material having the higher conductivity than the lower layer, the lower layer formed of the material having the higher density than the upper layer.

In some embodiments, a composition of the IDT electrodes and reflector electrodes provides for a width of the SAW resonator in a propagation direction of a main acoustic wave generated in the SAW resonator during operation to be reduced by about 30% relative to substantially similar SAW resonator with IDT electrodes and reflector electrodes consisting of aluminum.

In some embodiments, the SAW resonator of further comprises a layer of dielectric disposed on an upper surface of the IDT electrodes and piezoelectric substrate. The layer of dielectric may include a layer of silicon dioxide, a layer of silicon oxynitride on the layer of silicon dioxide, and a layer of silicon nitride on the layer of silicon oxynitride.

In some embodiments, the layer of dielectric material is a continuous layer. The layer of dielectric material may be bonded to the lower surface of the layer of piezoelectric material beneath an entirety of the SAW resonator.

In some embodiments, the carrier substrate is formed of a material having a lower coefficient of thermal expansion than the piezoelectric material.

In some embodiments, the carrier substrate is formed of a material having a higher thermal conductivity than the piezoelectric material.

In some embodiments, the carrier substrate is formed of a material selected from the group consisting of silicon, aluminum nitride, silicon nitride, magnesium oxide spinel, magnesium oxide crystal, and sapphire.

In some embodiments, the upper layer of the plurality of IDT electrodes material is thicker than the lower layer of the plurality of IDT electrodes.

In some embodiments, a thickness of the dielectric material is less than a wavelength of a main acoustic wave generated in the SAW resonator during operation.

In some embodiments, an acoustic velocity of a main acoustic wave generated in the SAW resonator during operation is less than about 3000 m/s.

In accordance with another aspect, there is provided a radio frequency filter. The radio frequency filter includes at least one surface acoustic wave resonator comprising a plurality of interdigital transducer (IDT) electrodes disposed on a multilayer piezoelectric substrate including a layer of piezoelectric material having a lower surface bonded to an upper surface of a layer of a dielectric material, the dielectric material having a lower surface bonded to an upper surface of a carrier substrate, the plurality of IDT electrodes including an upper layer and a lower layer, the upper layer formed of a material having a higher conductivity than the lower layer, the lower layer formed of a material having a higher density than the upper layer to provide for reduction in size of the SAW resonator.

In accordance with another aspect, there is provided an electronics module. The electronics module has at least one radio frequency filter including at least one surface acoustic wave resonator comprising a plurality of interdigital transducer (IDT) electrodes disposed on a multilayer piezoelectric substrate including a layer of piezoelectric material having a lower surface bonded to an upper surface of a layer of a dielectric material, the dielectric material having a lower surface bonded to an upper surface of a carrier substrate, the plurality of IDT electrodes including an upper layer and a lower layer, the upper layer formed of a material having a higher conductivity than the lower layer, the lower layer formed of a material having a higher density than the upper layer to provide for reduction in size of the SAW resonator.

In accordance with another aspect, there is provided an electronic device with an electronics module having at least one radio frequency filter including at least one surface acoustic wave resonator comprising a plurality of interdigital transducer (IDT) electrodes disposed on a multilayer piezoelectric substrate including a layer of piezoelectric material having a lower surface bonded to an upper surface of a layer of a dielectric material, the dielectric material having a lower surface bonded to an upper surface of a carrier substrate, the plurality of IDT electrodes including an upper layer and a lower layer, the upper layer formed of a material having a higher conductivity than the lower layer, the lower layer formed of a material having a higher density than the upper layer to provide for reduction in size of the SAW resonator.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1A:
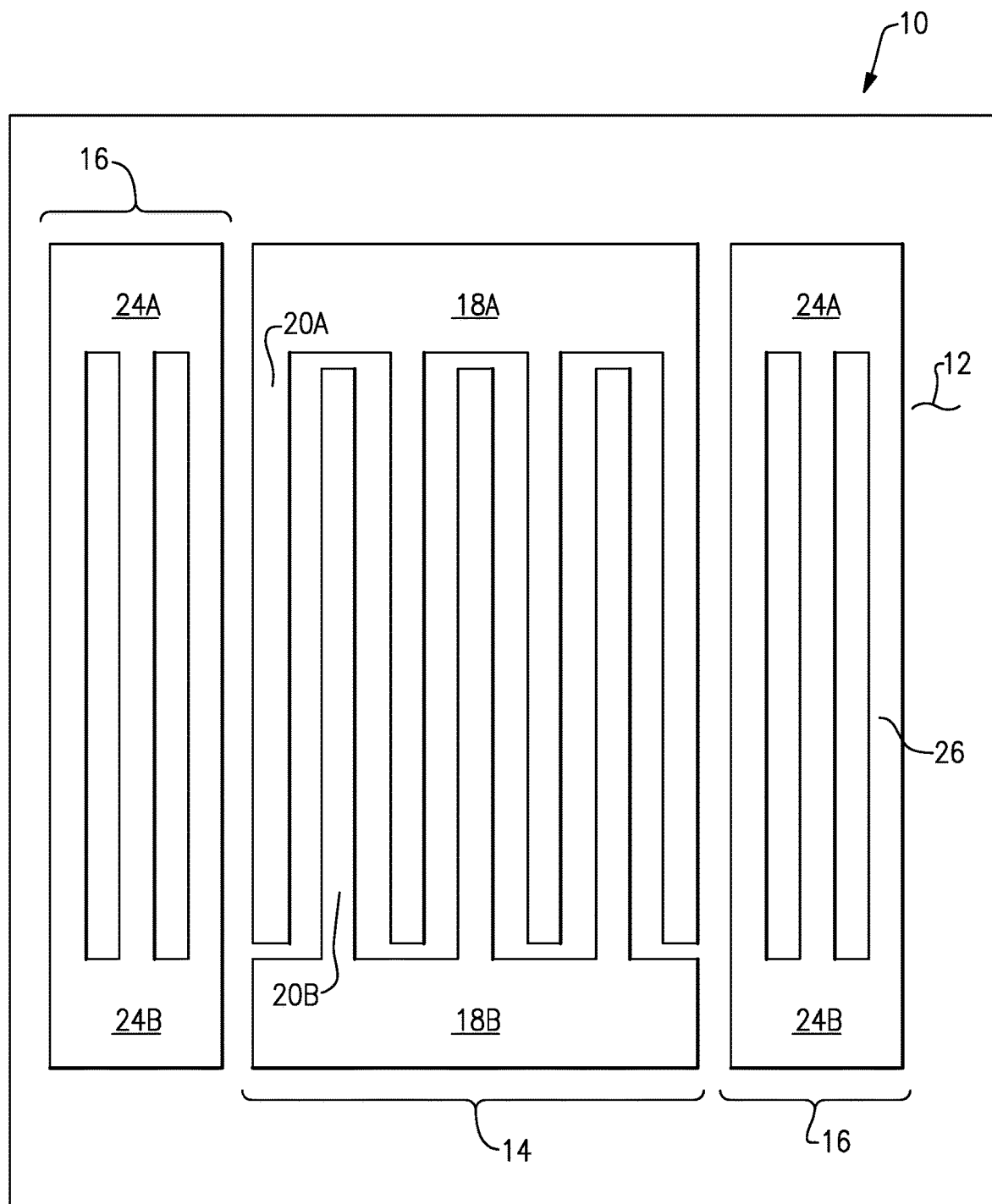
FIG. 1A is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1A is a plan view of a surface acoustic wave (SAW) resonator 10 such as might be used in a SAW filter, duplexer, balun, etc.

Acoustic wave resonator 10 is formed on a piezoelectric substrate, for example, a lithium tantalate (LiTaO$_3$) or lithium niobate (LiNbO$_3$) substrate 12 and includes Interdigital Transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first bus bar electrode 18A and a second bus bar electrode 18B facing first bus bar electrode 18A. The bus bar electrodes 18A, 18B may be referred to herein and labelled in the figures as busbar electrodes 18. The IDT electrodes 14 further include first electrode fingers 20A extending from the first bus bar electrode 18A toward the second bus bar electrode 18B, and second electrode fingers 20B extending from the second bus bar electrode 18B toward the first bus bar electrode 18A.

The reflector electrodes 16 (also referred to as reflector gratings) each include a first reflector bus bar electrode 24A and a second reflector bus bar electrode 24B (collectively referred to herein as reflector bus bar electrodes 24) and reflector fingers 26 extending between and electrically coupling the first bus bar electrode 24A and the second bus bar electrode 24B.

Figure 1B:
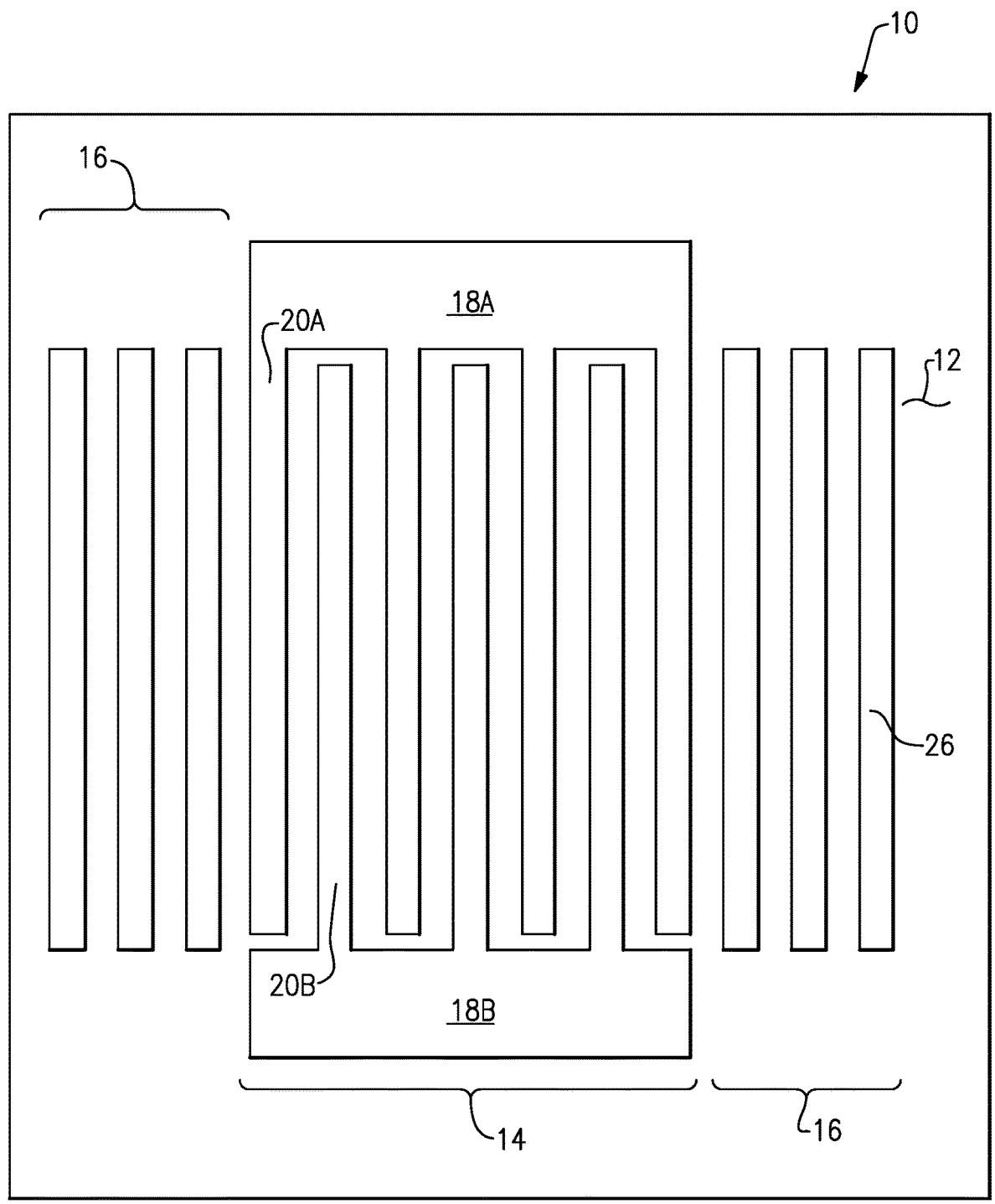
FIG. 1B is a simplified plan view of another example of a surface acoustic wave resonator.
Figure 1C:
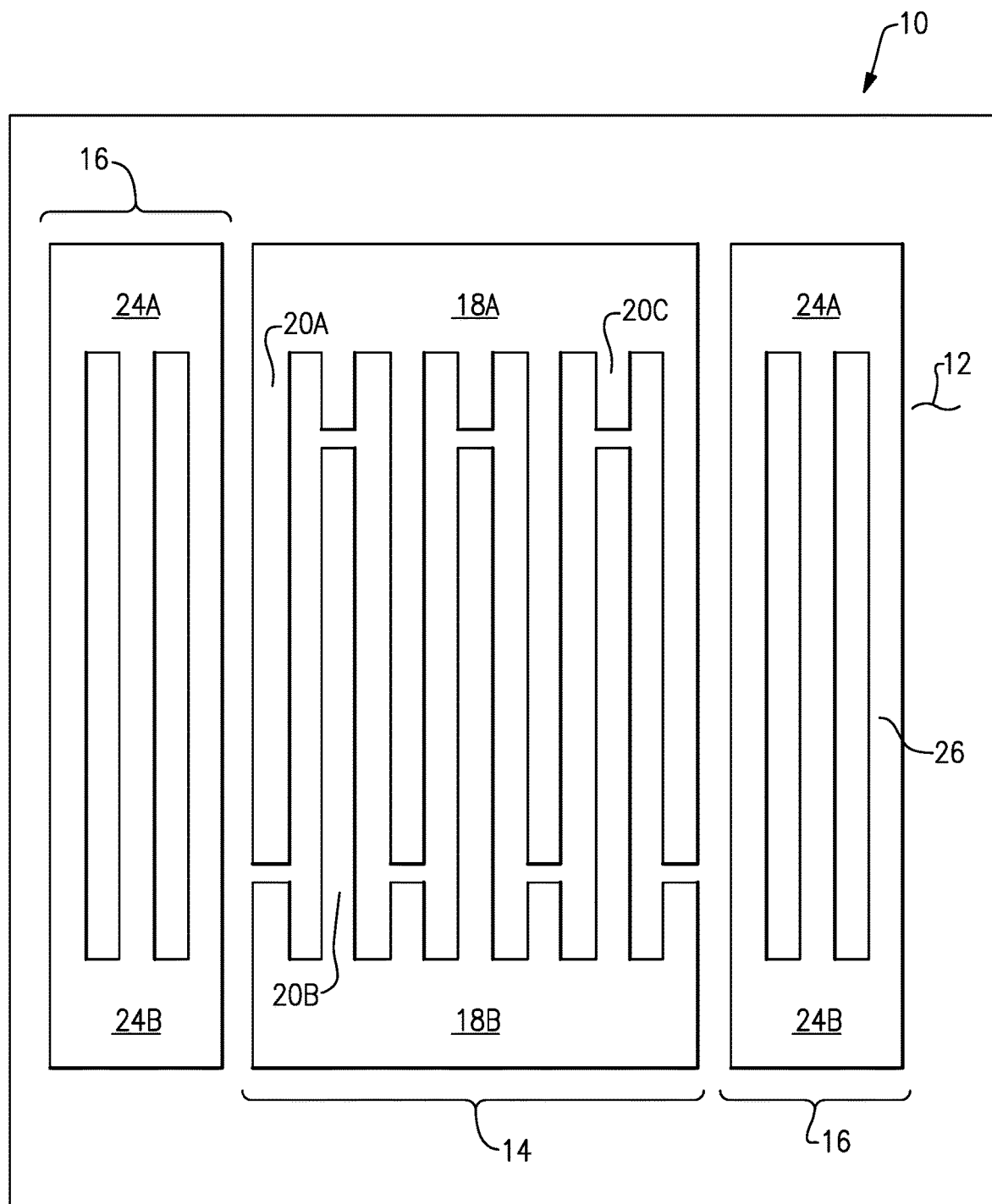
FIG. 1C is a simplified plan view of another example of a surface acoustic wave resonator.

In other embodiments disclosed herein, as illustrated in FIG. 1B, the reflector bus bar electrodes 24A, 24B may be omitted and the reflector fingers 26 may be electrically unconnected. Further, as illustrated in FIG. 1C, acoustic wave resonators as disclosed herein may include dummy electrode fingers 20C that are aligned with respective electrode fingers 20A, 20B. Each dummy electrode finger 20C extends from the opposite bus bar electrode 18A, 18B than the respective electrode finger 20A, 20B with which it is aligned.

It should be appreciated that the acoustic wave resonators 10 illustrated in FIGS. 1A-1C, as well as the other circuit elements illustrated in other figures presented herein, are illustrated in a highly simplified form. The relative dimensions of the different features are not shown to scale. Further, typical acoustic wave resonators would commonly include a far greater number of electrode fingers and reflector fingers than illustrated. Typical acoustic wave resonators or filter elements may also include multiple IDT electrodes sandwiched between the reflector electrodes.

Figure 2:
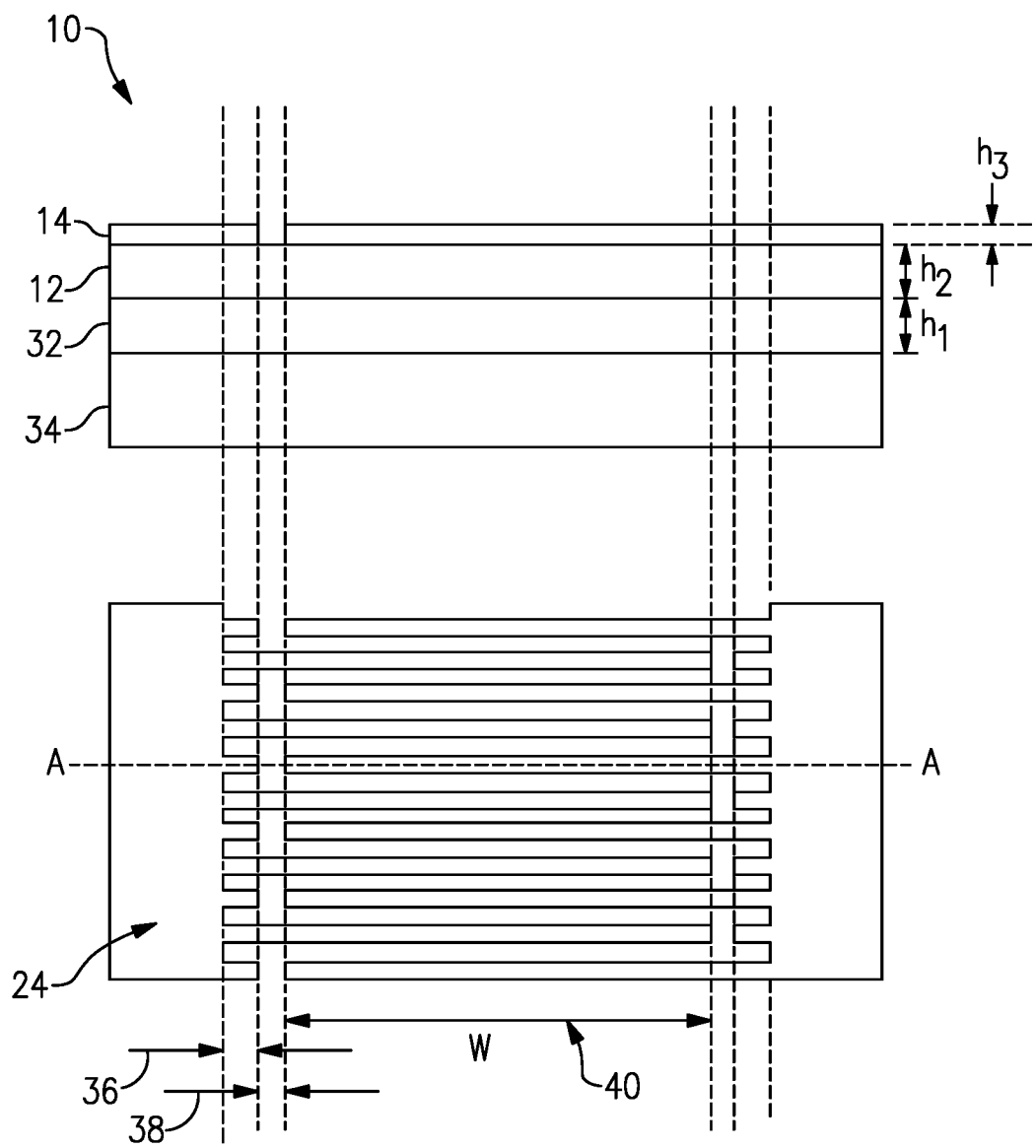
FIG. 2 is a simplified cross-sectional view of an example of a surface acoustic wave resonator.

FIG. 2 presents a cross-sectional view of a region including the IDT electrodes 14 of an example of acoustic wave resonator 10 similar to that illustrated in FIG. 1C and a corresponding plan view of the IDT electrodes 14. The cross-sectional view in FIG. 2 is along the line A-A in the plan view. The acoustic wave resonator 10 of FIG. 2 includes a multilayer piezoelectric substrate. A layer of piezoelectric material forming the piezoelectric substrate 12 is disposed on a layer of a dielectric 32, for example, silicon dioxide ($SiO_2$). The layer of dielectric 32 is disposed on a carrier substrate 34 which may be formed of silicon, sapphire, alumina, or any other suitable material. The piezoelectric material may be, for example, 10°-60° Y cut, X propagation lithium tantalate and may have a thickness $h_2$ of between about 0.1λ and about 1λ, for example, about 0.3λ. The layer of dielectric 32 may have a thickness $h_1$ of between about 0.1λ and about 1λ, for example, about 0.3λ. The IDT electrode 14 may have a thickness $h_3$ of between about 0.02λ and about 0.1λ, for example, about 0.08λ. The thickness of the carrier substrate 34 is not critical but may be selected to be sufficiently thick to provide the device with a desired degree of mechanical strength, for example, about 350 μm or more. As illustrated in the plan view in FIG. 2 the IDT electrodes 14 include bus bars 24, dummy regions 36 in which the dummy electrodes 20C (see FIG. 1C) are present, gap regions 38 between the tips of dummy electrodes 20C extending from one busbar 24 and tips of aligned electrode fingers 20A, 20B extending from the opposite busbar 24, and an aperture region 40 in which electrode fingers 20A, 20B extending from opposite busbars 24 are interleaved with one another. The dummy regions 36 may have a width of from about 0λ to about 3λ. The gap regions 38 may have widths of between about 0.1λ and about 2λ. The aperture region 40 may have a width W of between about 5λ and about 50λ. It is to be understood that these dimensions are only examples and may be set at different values in different embodiments of acoustic wave resonators to achieve different design goals.

The carrier substrate 34 may be formed of a material having a lower coefficient of linear expansion and/or a higher thermal conductivity and/or a higher toughness or mechanical strength than the piezoelectric substrate 12. The carrier substrate 34 may both increase the mechanical robustness of the piezoelectric substrate during fabrication of SAW resonators on the substrate and increase manufacturing yield as well as reduce the amount by which operating parameters of the SAW resonators formed on the piezoelectric substrate change with temperature during operation.

Figure 3:
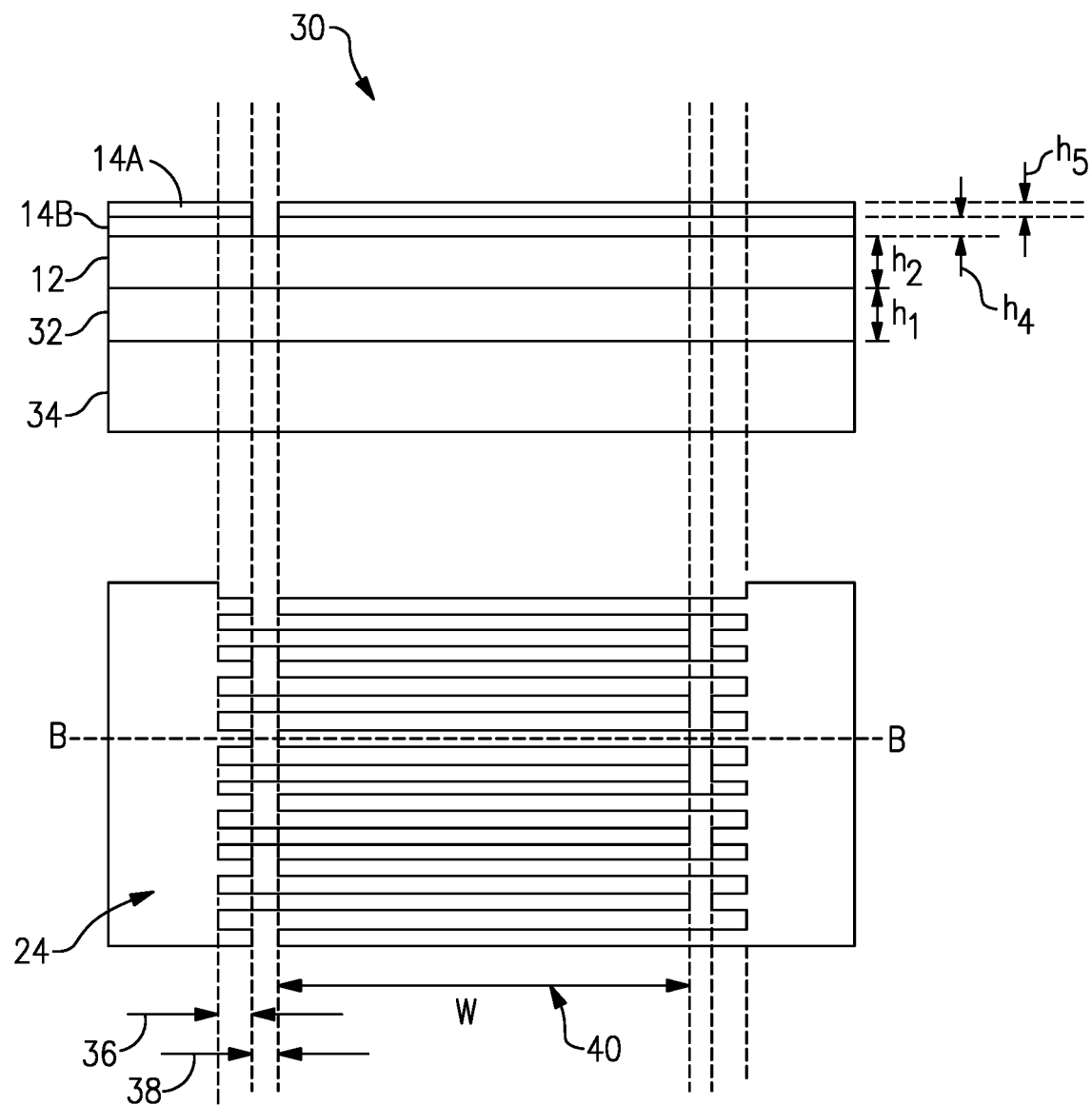
FIG. 3 is a simplified cross-sectional view of an example of a surface acoustic wave resonator in accordance with the present disclosure.

As discussed above, one example of a material that may be utilized for the carrier substrate 34 may be silicon (Si). The silicon may be provided in the form of a wafer that is bonded to the lower surface of a wafer of piezoelectric material opposite the upper surface of the wafer of piezoelectric material upon which features of SAW resonators, such as IDT electrodes and reflector electrodes, as well as other circuitry, for example, conductive traces, passive devices, etc., may be formed. The silicon may be bonded to the piezoelectric material via a thin layer of dielectric 32, such as silicon dioxide as illustrated in FIGS. 2 and 3. In some embodiments, a layer of silicon dioxide may be grown or deposited on the lower surface of the piezoelectric material and a layer of silicon dioxide may be grown or deposited on the upper surface of the silicon material. The piezoelectric material and silicon may then be joined by anodic bonding or other methods of joining layers of silicon dioxide known in the art.

The silicon layer may be a continuous layer. The silicon layer may be present on the lower surface of the piezoelectric material layer under all areas where SAW resonators and/or additional circuitry is formed on the piezoelectric material layer.

Silicon has mechanical and thermal properties that may benefit SAW resonator structures when bonded to the piezoelectric substrate of the SAW resonator structures as illustrated in FIGS. 2 and 3. The thermal coefficient of expansion of silicon is about 2.6 ppm/° K. which is significantly lower than that of conventional materials used as piezoelectric substrates in SAW resonator structures such as lithium niobate (from about 7.5 ppm/° K. to 15.4 ppm/° K., depending on crystallographic direction). Silicon has a thermal conductivity of about 1.3 W/cm·K, more than 20 times the 0.06 W/cm·K thermal conductivity of lithium niobate. Silicon is also significantly less fragile than lithium niobate. Bonding the silicon to the bottom of the piezoelectric substrate may, in some examples, reduce the temperature coefficient of frequency (TCF) of the SAW resonator at the resonant frequency (fs) and at the anti-resonant frequency (fp). Mechanical robustness, and thus wafer handling, of the piezoelectric material/silicon dioxide/silicon multilayer substrate may be improved relative to that of a piezoelectric substrate without the bonded silicon. Heat dissipation of the piezoelectric material/silicon dioxide/silicon multilayer substrate may be improved relative to that of a piezoelectric substrate without the bonded silicon. Operating parameters of the SAW resonator such as quality factor Q and coupling coefficient K2 are unaffected by the bonding of the silicon to the lower surface of the piezoelectric substrate.

In another embodiment illustrated in FIG. 3, in which similar reference numerals refer to similar features as in FIG. 2, the IDT electrodes may be layered electrodes including an upper layer 14A of a highly conductive but low-density material, for example, aluminum (Al), and a lower layer 14B of a more dense material, for example, molybdenum (Mo), tungsten (W), copper (Cu), gold (Au), silver (Ag), platinum (Pt), ruthenium (Ru), or iridium (Ir). The material of the lower layer 14B may have a lower conductivity than the material of the upper layer 14A. The upper and lower layers 14A and 14B may be collectively referred to as IDT electrode 14. The denser lower layer 14B may reduce the acoustic velocity of acoustic waves travelling through the device which may allow the IDT electrode fingers to be spaced more closely for a given operating frequency and allow the SAW device to be reduced in size as compared to a similar device utilizing less dense IDT electrodes. The less dense upper layer 14A may have a higher conductivity than the lower layer 14B to provide the electrode stack with a lower overall resistivity. The thickness of the upper and lower layers 14A, 14B may vary depending upon a particular material from which they are formed. In some embodiments, the upper layer 14A may have thickness of between about 0.02λ and about 0.1λ, for example, about 0.08λ, and the lower layer 14B may have a thickness of between about 0.02λ and about 0.08λ, for example, about 0.4λ.

Figure 4:
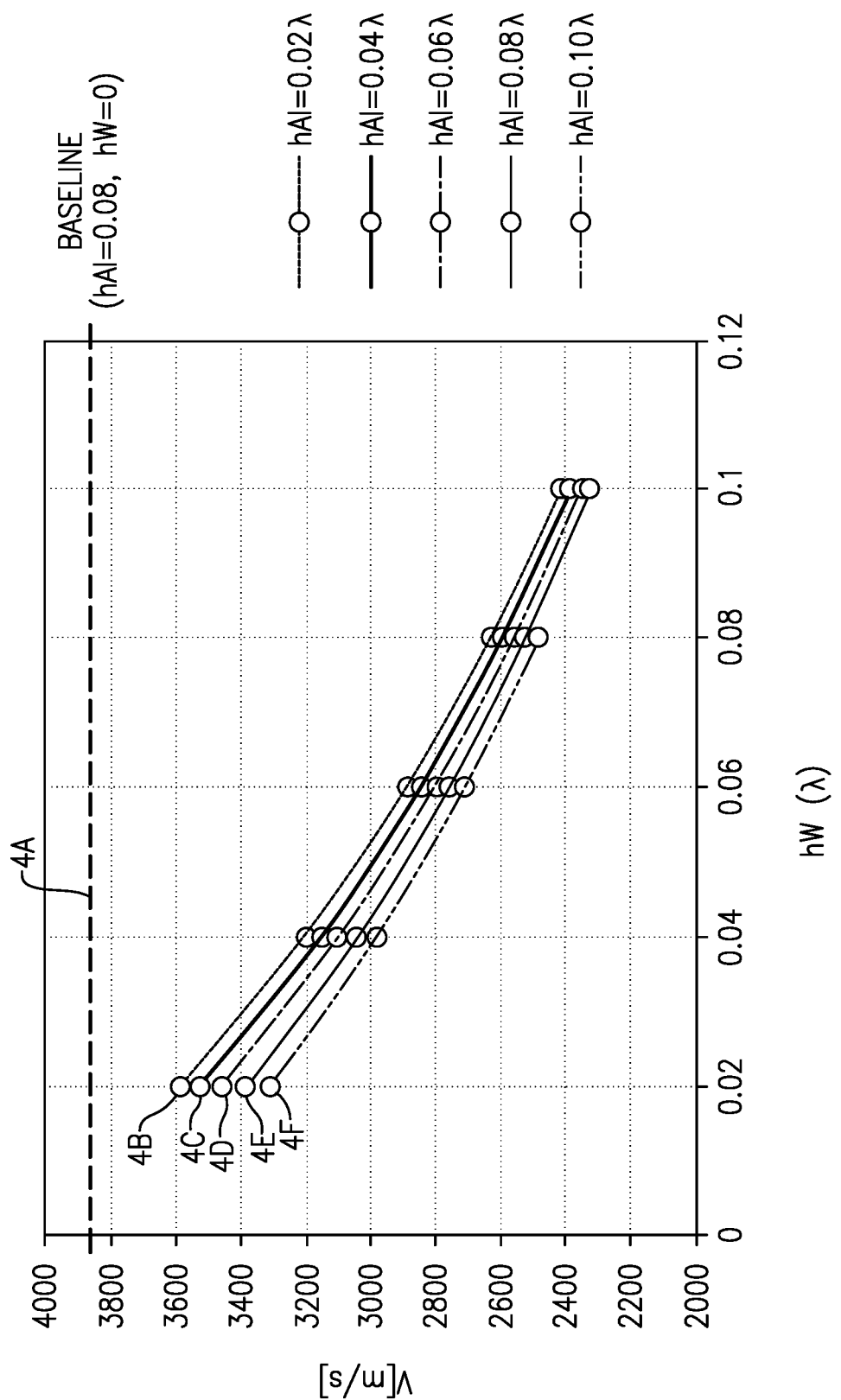
FIG. 4 is a chart of SAW acoustic velocity as a function of interdigital transducer composition.

The effect of the thickness of the electrode layers 14A, 14B on the acoustic velocity of a main acoustic wave generated by the IDT electrodes 14 and passing through an example of a SAW resonator as disclosed herein is illustrated in FIG. 4. The simulation performed to generate the curves in FIG. 4 assumed an upper electrode layer 14A formed of Al, and a lower electrode layer 14B formed of Mo, a lithium tantalate piezoelectric layer 12 thickness of 0.3λ, and a silicon dioxide dielectric layer 32 thickness of 0.3λ. The thicknesses illustrated in FIG. 4 are expressed in terms of a fraction of λ. In FIG. 4 curve 4A represents a baseline example with IDT electrodes having an 0.08λ thick Al-only layer, curve 4B represents an example with multilayer IDT electrodes with a 0.02λ thick Al layer, curve 4C represents an example with multilayer IDT electrodes with a 0.04λ thick Al layer, curve 4D represents an example with multilayer IDT electrodes with a 0.06λ thick Al layer, curve 4E represents an example with multilayer IDT electrodes with a 0.08λ thick Al layer, and curve 4F represents an example with multilayer IDT electrodes with a 0.1λ thick Al layer. As can be seen from FIG. 4, the acoustic velocity shows a much greater dependence on the thickness of the lower layer 14B (hW) than on the thickness of the upper electrode layer 14A (hAl). The presence of the lower electrode layer 14B reduces the acoustic velocity from a baseline including an IDT electrode 14 formed only of a 0.8λ thick layer of Al.

Figure 5:
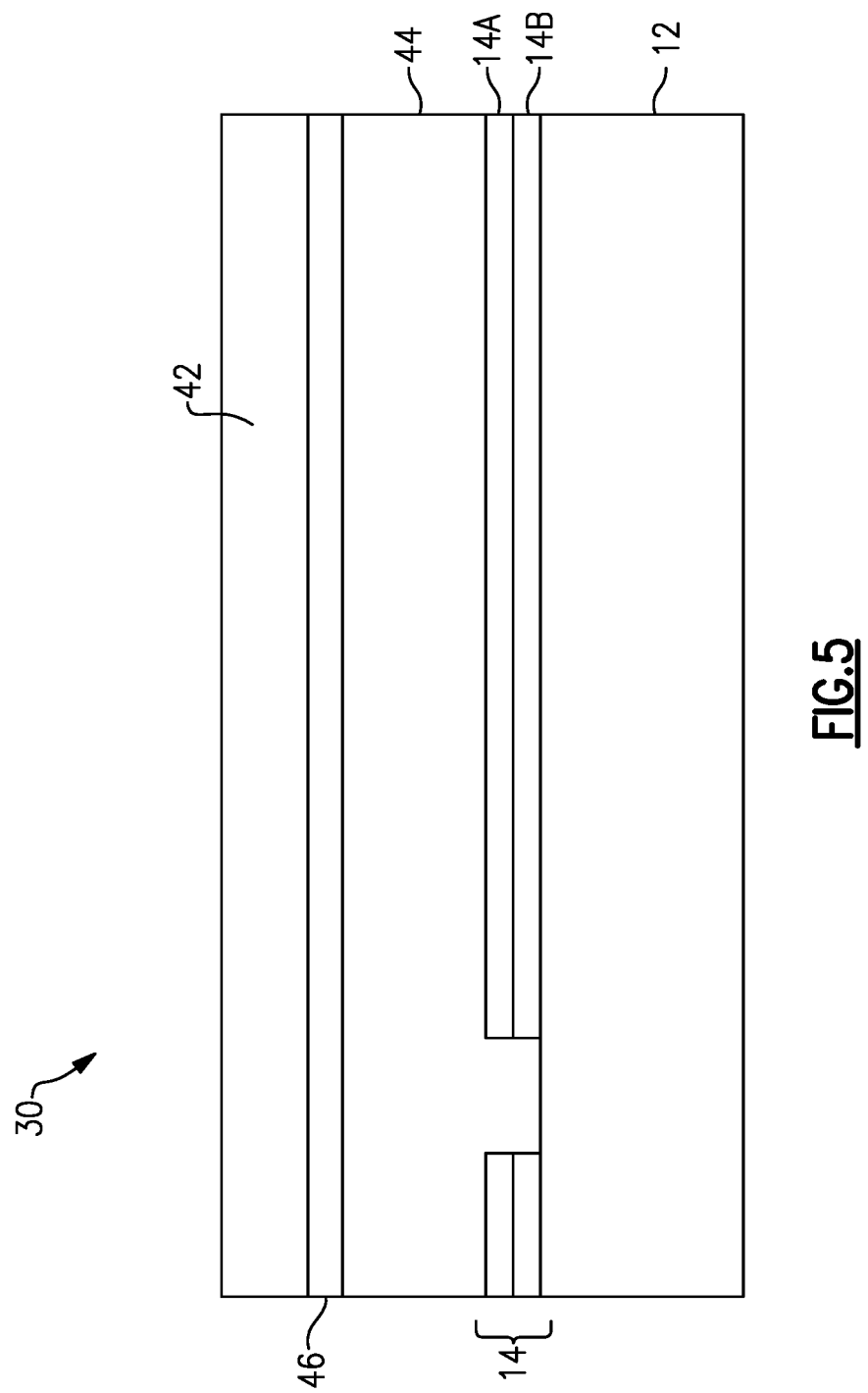
FIG. 5 is a simplified partial cross-sectional view of another example of a surface acoustic wave resonator in accordance with the present disclosure.

In some embodiments, as illustrated in FIG. 5, a layer of a dielectric 42 exhibiting a high acoustic wave velocity, for example, silicon nitride ($Si_3N_4$, also abbreviated as "SiN" herein) may be disposed over the IDT electrodes of the SAW resonator 10, 30. In some embodiments, the layer of high acoustic wave velocity material 42 may be deposited over a dielectric material 44 having a lower acoustic wave velocity, for example, silicon dioxide ($SiO_2$) disposed over the IDT electrode structure. An intermediate layer 46 of, for example, silicon oxynitride (SiON) may optionally be disposed between the high velocity dielectric layer 42 and the lower acoustic velocity layer 44. The intermediate layer 46 may exhibit an acoustic velocity between the acoustic velocities of the layers 42 and 44.

The $SiO_2$ layer 44 may have a negative temperature coefficient of frequency, which helps to offset the positive temperature coefficient of frequency of the piezoelectric substrate 12 and reduce the change in frequency response of the SAW device with changes in temperature. A SAW device with a layer of $SiO_2$ over the IDT electrodes may thus be referred to as a temperature-compensated SAW device, or TCSAW.

IDT electrodes having a multilayer structure with an upper layer 14A of a highly conductive material such as Al and a denser lower layer 14B formed of, for example, W may exhibit a higher reflectivity to acoustic waves in an acoustic wave device (e.g., a SAW resonator) than IDT electrodes formed of only a single layer of Al. Accordingly, if the multilayer structure of the IDT electrodes as described above were also used in the fingers 26 of reflector electrodes 16 which sandwich the IDT electrodes 14, for example, as illustrated in FIGS. 1A-1C the number of reflector electrode fingers 26 needed to provide for a given amount of acoustic wave reflection may be reduced as compared to a device including reflector electrode fingers formed of only a single layer of Al. The quality factor (Q) value of a SAW resonator is related to the reflectivity of the reflector electrodes 16 sandwiching the IDT electrodes 14.

Figure 6:
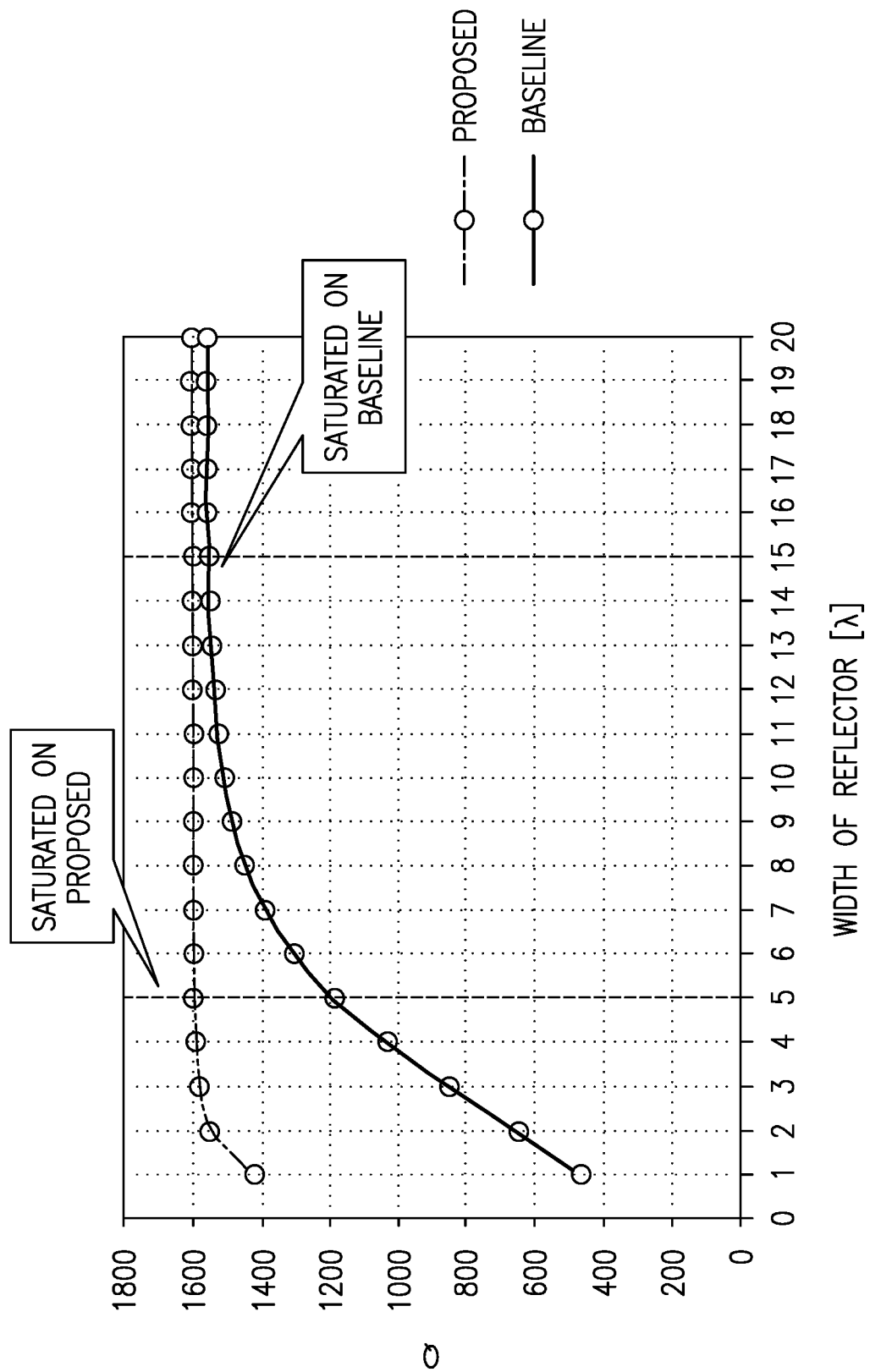
FIG. 6 is a chart of quality factor as a function of number of reflector electrode fingers in a baseline SAW resonator as compared to a SAW resonator in accordance with an embodiment of the present disclosure.

A simulation was performed to determine the effect of changing the reflector electrodes of a SAW device from having only a single 0.08λ thick layer of Al (baseline structure) to having a multilayer structure including a 0.08λ thick upper layer of Al and a 0.04λ thick lower layer of W (proposed structure). The aperture of the modeled SAW device was 75λ across. The results of this simulation are illustrated in FIG. 6. As can be observed from the chart in FIG. 6, for the SAW device with the multilayer reflector electrode fingers, the Q value saturated when the width of each reflector electrode reached about 5λ (10 reflector fingers in each reflector). In comparison, the Q value for the SAW device with the Al-only reflector electrode fingers did not saturate until the width of each reflector electrode reached about 15λ (30 reflector fingers in each reflector). These results show that by switching from Al-only reflector electrode fingers to reflector electrode fingers with an upper layer of Al and a lower layer of W a SAW device may exhibit a comparable Q factor but with significantly fewer reflector electrode fingers, and correspondingly thinner reflector electrodes.

Figure 7:
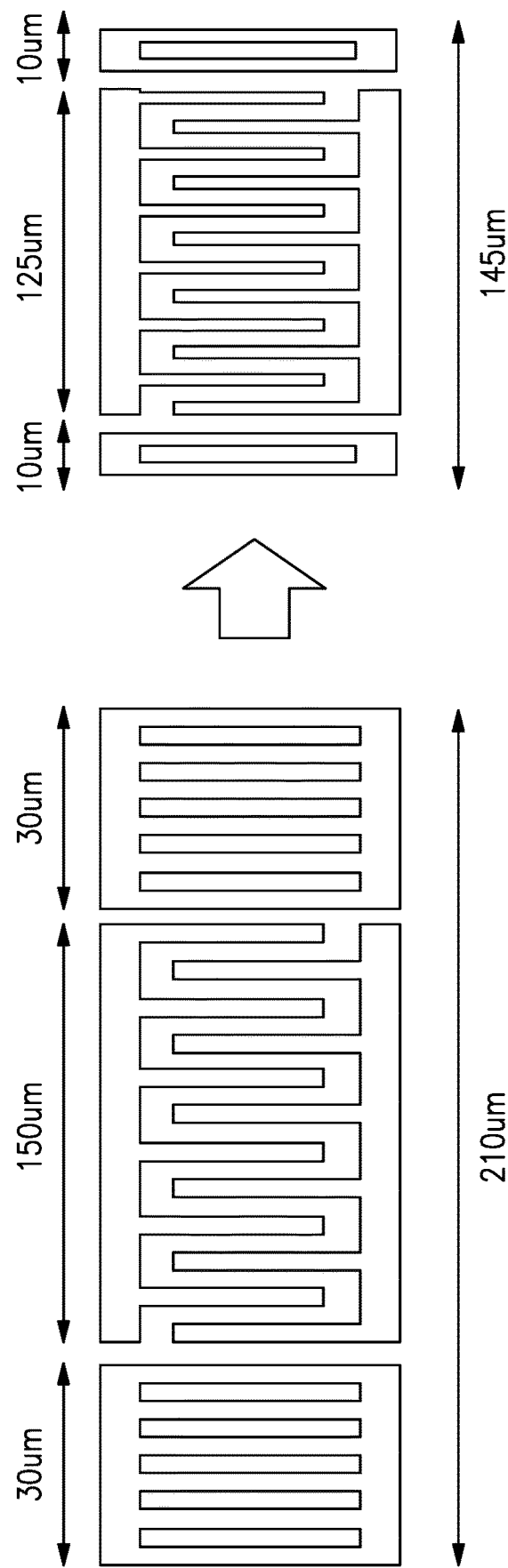
FIG. 7 illustrates a reduction in size of a SAW resonator achievable in accordance with embodiments disclosed herein.

The combination of the reduction in IDT electrode pitch to achieve a given λ in a SAW device and the achievable reduction in reflector electrode fingers when switching from Al-only IDT and reflector electrodes to IDT and reflector electrodes including un upper layer of a high conductivity material such as Al and a lower layer of a dense material such as W may provide for an overall shrinking of the SAW device while maintaining the same λ and Q factor. As illustrated in FIG. 7, in one example, switching from Al-only IDT and reflector electrodes to multilayer IDT and reflector electrodes as disclosed herein may allow for a reduction in total SAW resonator width of from about 210 μm to about 145 μm, a reduction of about 30%. In the example of FIG. 7 the reduction in IDT electrode pitch allowed for the reduction in width of the aperture of the SAW device from 150 μm to 125 μm and a reduction in reflector electrode width from 30 μm to 10 μm. This reduction in SAW device size may provide for more devices to be formed per given amount of area or for a circuit having a certain number of SAW devices to be reduced in size.

Figure 8:
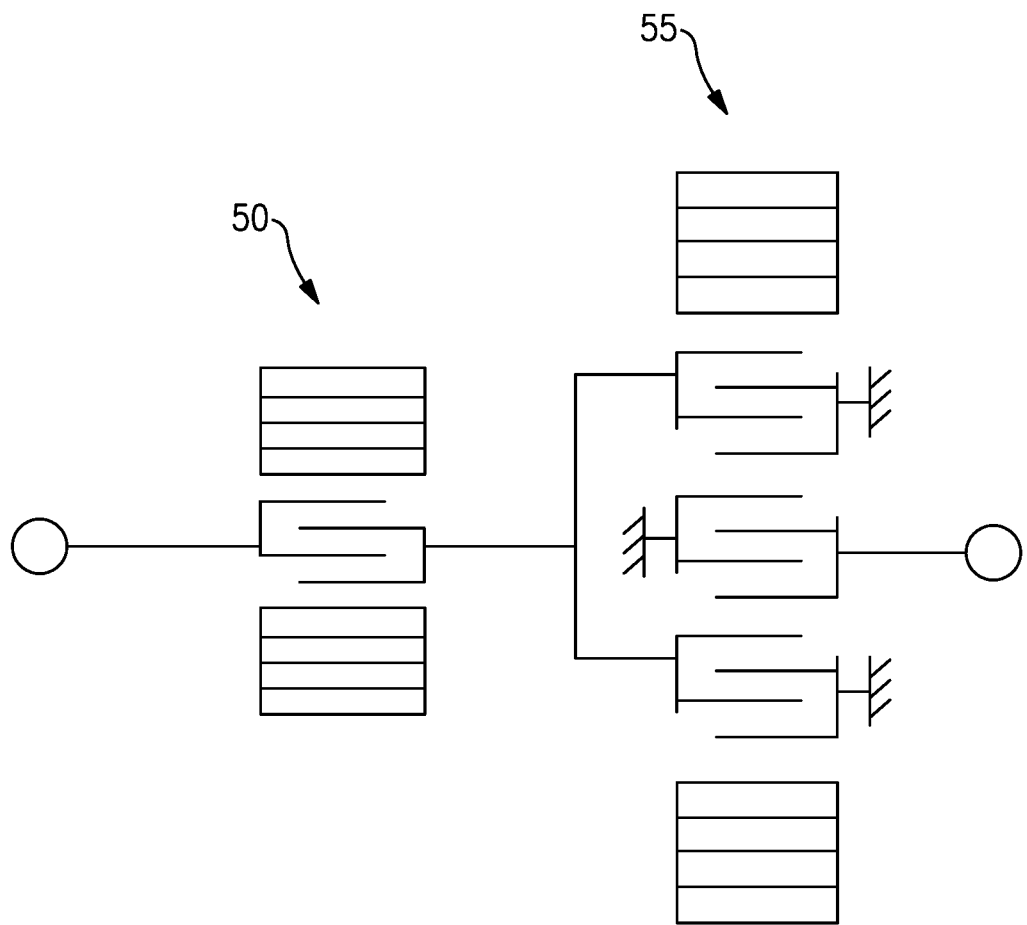
FIG. 8 illustrate the topology of an example filter including SAW resonators.
Figure 9:
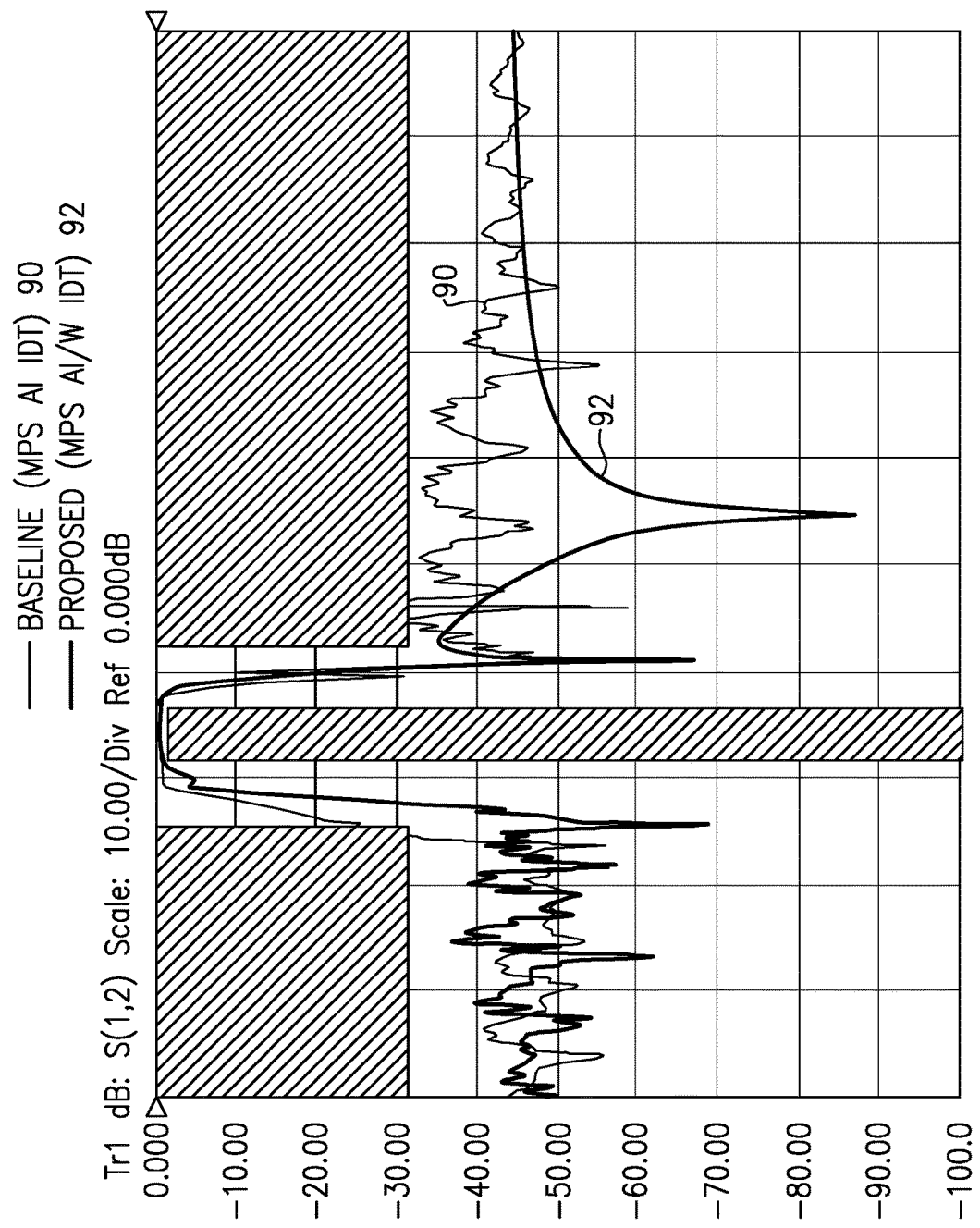
FIG. 9 is a chart of admittance characteristics of the filter of FIG. 8 including SAW resonators having a baseline configuration as compared to admittance characteristics of the filter of FIG. 8 including SAW resonators having an example of a configuration as disclosed herein.

Simulations were performed to compare the performance of a filter having an upstream SAW resonator 50 and a downstream dual-mode SAW (DMS) resonator 55 having the topology illustrated in FIG. 8 when the resonators were formed with Al-only IDT and resonator electrodes (baseline) versus when formed with Al/W layered IDT and reflector electrodes (proposed) as disclosed herein. The admittance curves of the baseline and proposed examples are compared in the chart of FIG. 9. As can be seen from the chart in FIG. 9, the proposed example with the Al/W layered IDT and reflector electrodes (curve 92) exhibited much smoother attenuation characteristics above the passband of the filter than the baseline example with the Al-only IDT and resonator electrodes (curve 90). Further, the passband exhibited a sharper lower end in the proposed example than in the baseline example.

Figure 10:
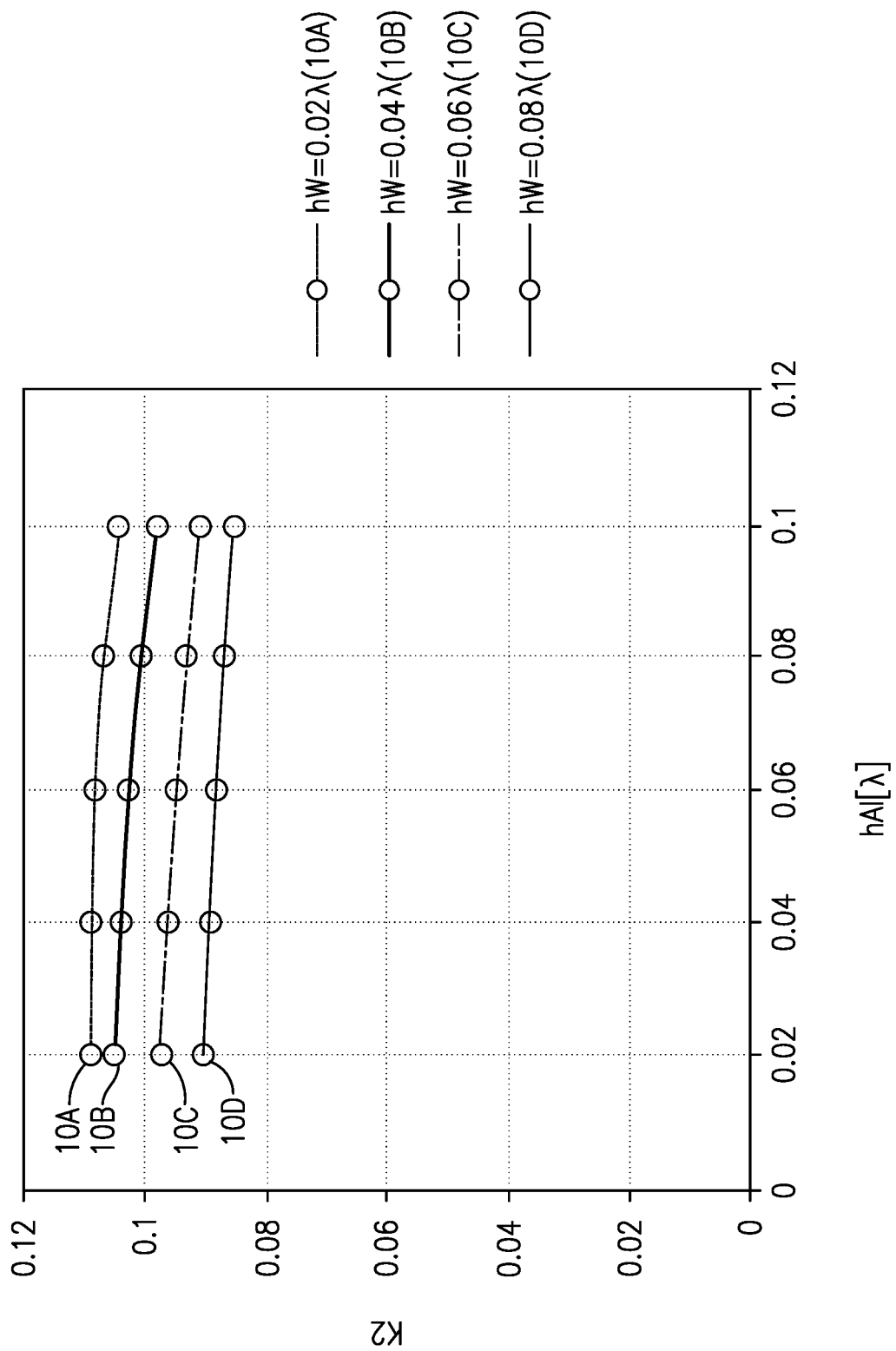
FIG. 10 illustrates results of a simulation to determine the effect on coupling coefficient in a SAW resonator as disclosed herein with changes in thicknesses of the layers of the electrodes in the resonator.
Figure 11:
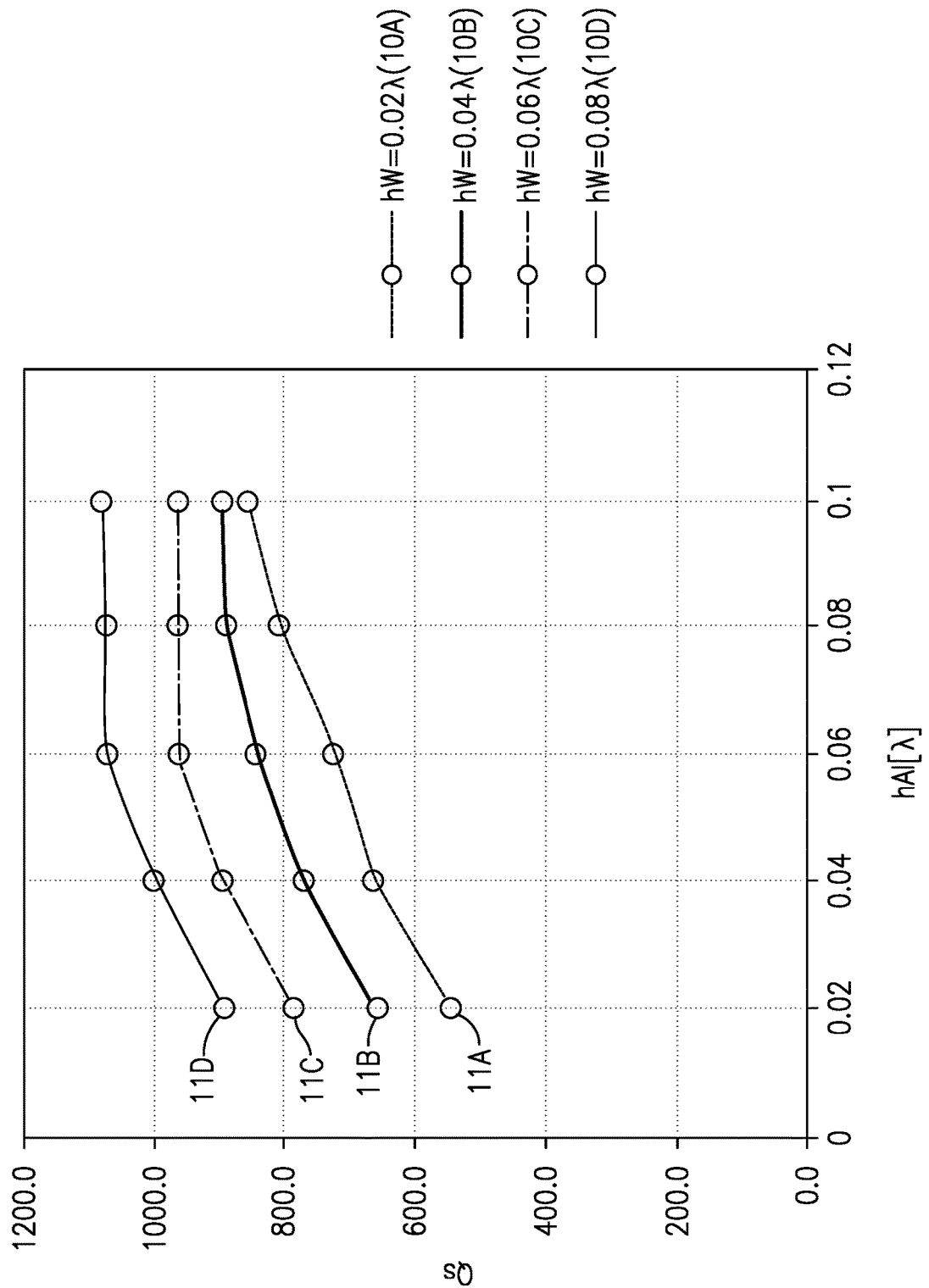
FIG. 11 illustrates results of a simulation to determine the effect on quality factor in a SAW resonator as disclosed herein with changes in thicknesses of the layers of the electrodes in the resonator.

Simulations were performed with a SAW resonator modeled as illustrated in FIG. 3 with the thickness of the lithium tantalate layer and silicon dioxide layer both being 0.3λ and with varying thicknesses of the Al (hAl) and W (hW) layers. As illustrated in FIG. 10 the coupling coefficient K2 decreased with both increasing Al layer thickness and W layer thickness. The effect was greater for changes in the W layer thickness than for changes in the Al layer thickness as can be seen as the W layer thickness increased from 0.02λ to 0.08λ (curves 10A-10D, respectively). In contrast, as illustrated in FIG. 11, the quality factor Q of the resonator increased with both increasing Al layer thickness and W layer thickness. The effect was approximately the same for changes in the Al layer thickness and for changes in the W layer thickness (curves 11A-11D, respectively). The increase in Q with increasing electrode layer thicknesses may be sufficient enough to overcome disadvantages associated with a corresponding decrease in K2 depending on the design goals for a particular device.

Figure 12:
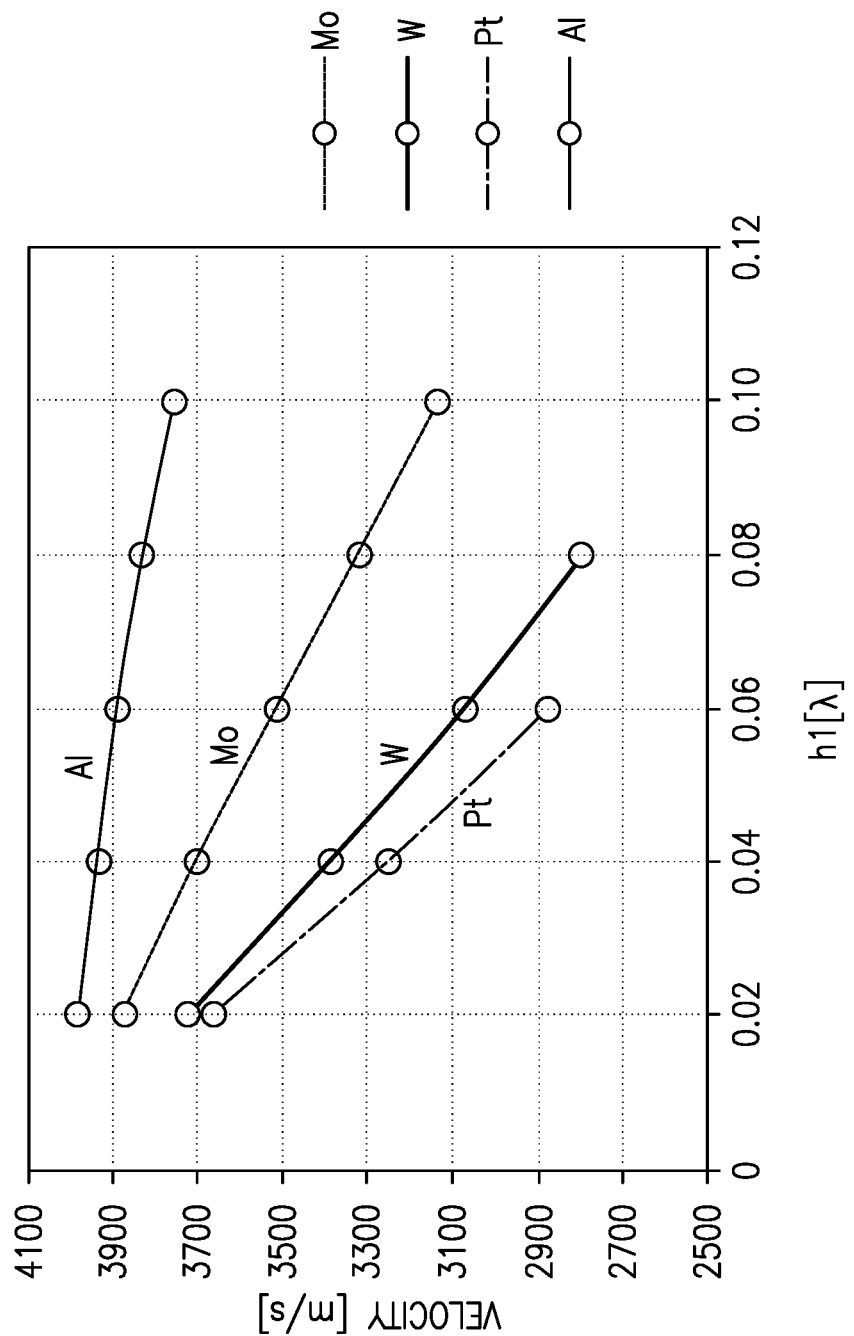
FIG. 12 illustrates results of a simulation to determine the effect on acoustic velocity in a SAW resonator as disclosed herein with changes in thicknesses of the lower layer of the electrodes in the resonator and changes in the material of the lower layer of the electrodes.

Simulations were performed with a SAW resonator modeled as illustrated in FIG. 3 with the thickness of the lithium tantalate layer and silicon dioxide layer both being 0.3λ, the thicknesses of the Al layer fixed at 0.04λ and with different thicknesses h1 of the lower electrode layer 14B and using different materials (Mo, W, Pt, or Al). Acceptable size reduction of SAW resonators can be achieved when utilizing Mo as the material for the lower electrode layer 14B. Even further size reductions may be achievable when utilizing a material that is denser than Mo for the lower electrode layer 14B. As can be seen in the chart of FIG. 12 acoustic velocity of the main acoustic wave through the resonator decreased with increasing lower electrode layer thickness and with increasing lower electrode layer material density. Pt is more dense than W which is more dense than Mo which is more dense than Al. Accordingly, increasing the thickness or density of the lower electrode layer 14B may decrease the acoustic velocity of the resonator and allow for a reduced width of the resonator for a given operating frequency.

Figure 13:
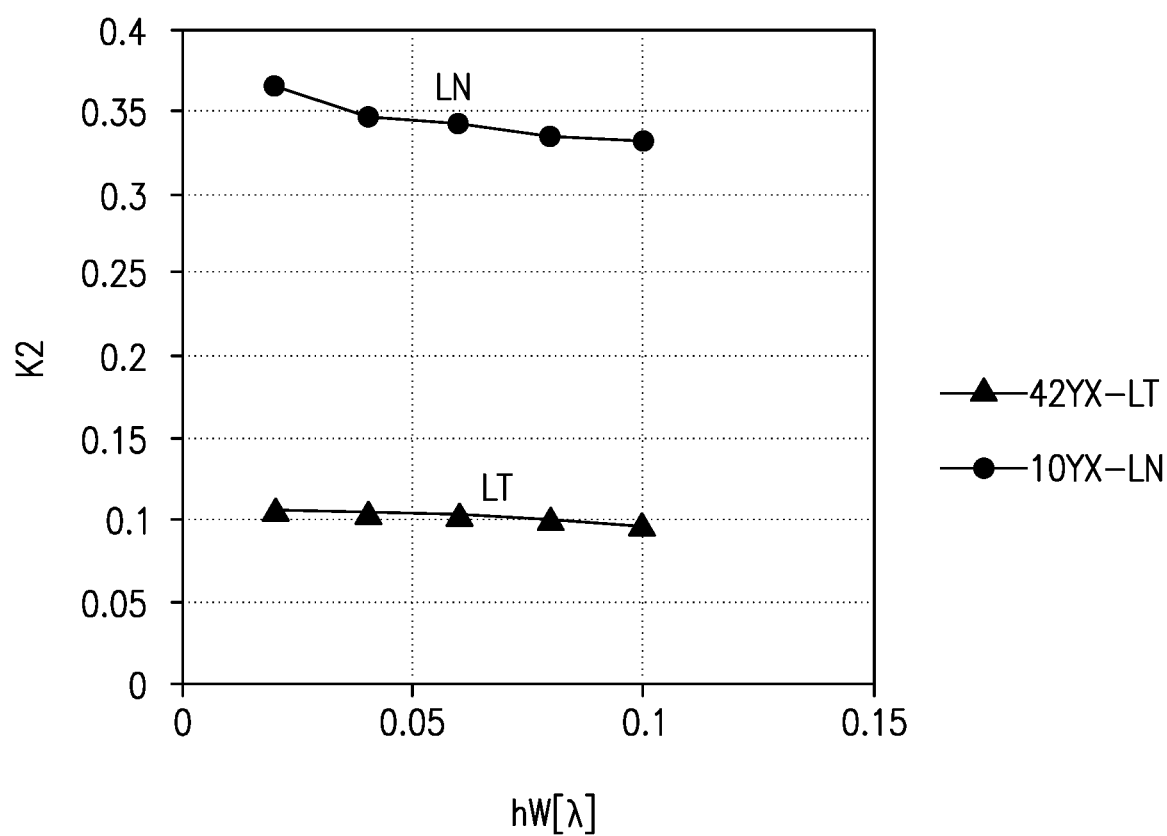
FIG. 13 illustrates results of a simulation to determine the effect on coupling coefficient in a SAW resonator as disclosed herein with changes in material of the piezoelectric material layer.

Simulations were performed with a SAW resonator modeled as illustrated in FIG. 3 with the thickness of the piezoelectric material layer and silicon dioxide layer both being 0.3λ, the thicknesses of the Al layer fixed at 0.04λ and with different thicknesses h1 of the lower W electrode layer 14B and different types of piezoelectric material. From the chart in FIG. 13 it can be seen that, consistent with the results shown in FIG. 10, K2 decreased with increasing W electrode layer thickness. The type of piezoelectric material used had a much greater effect on K2 than the change in W electrode layer thickness. A much higher K2 was observed when using lithium niobate (LN) as the piezoelectric material than when using lithium tantalate (LT).

Figure 14:
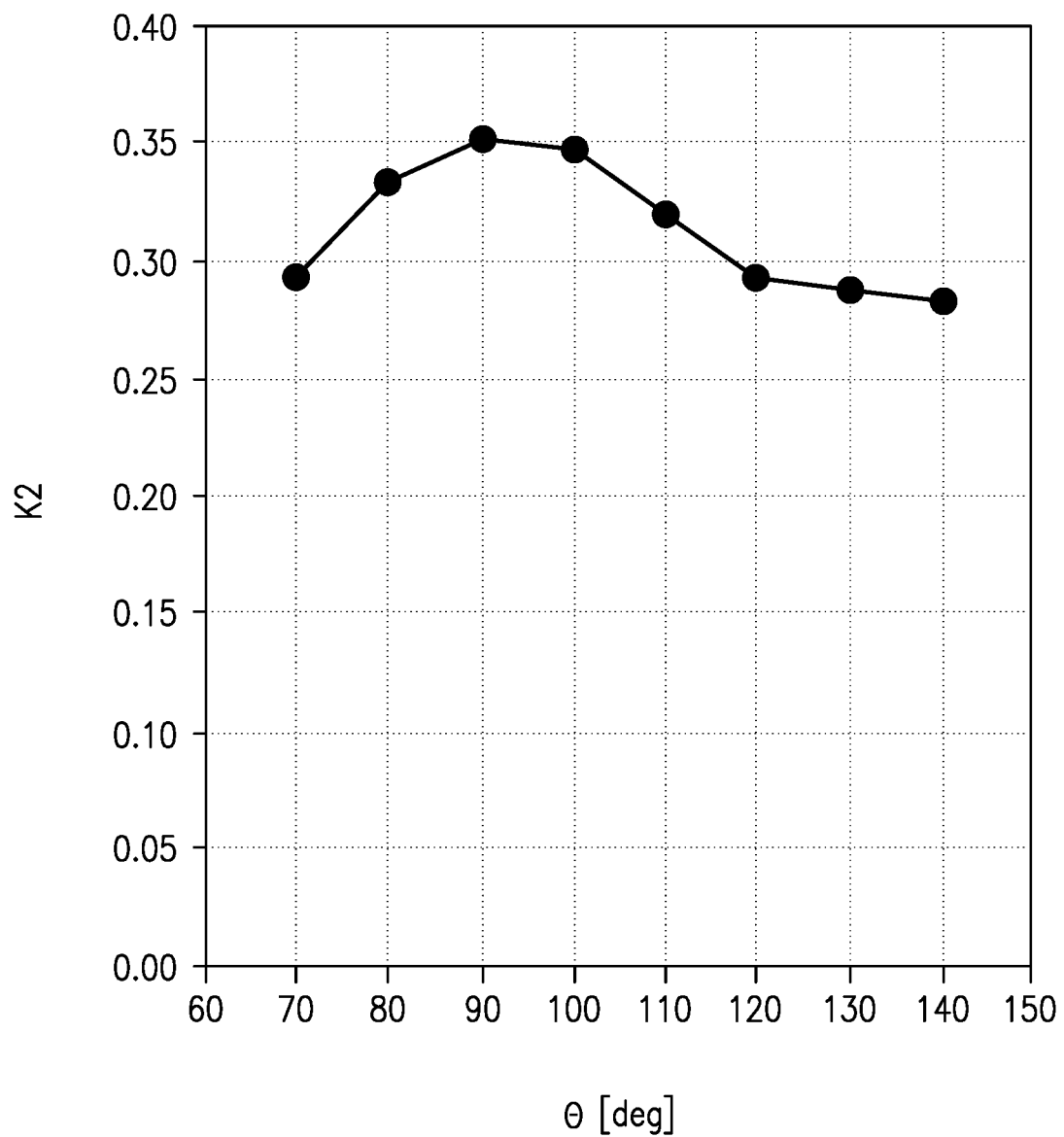
FIG. 14 illustrates results of a simulation to determine the effect on coupling coefficient in a SAW resonator as disclosed herein with changes in cut angle of the material of the piezoelectric material layer.

Further simulations were performed to determine the effect of cut angle of the piezoelectric material on K2. As can be seen in the chart of FIG. 14 K2 varied from between about 0.28 and 0.35 as the cut angle θ of a lithium niobate substrate varied between 70 degrees and 130 degrees. Accordingly, 70 deg<θ<130 deg (−20 YX-LN to +40 YX-LN) may be a suitable range of LN cut angle for acoustic resonators as disclosed herein.

Figure 15:
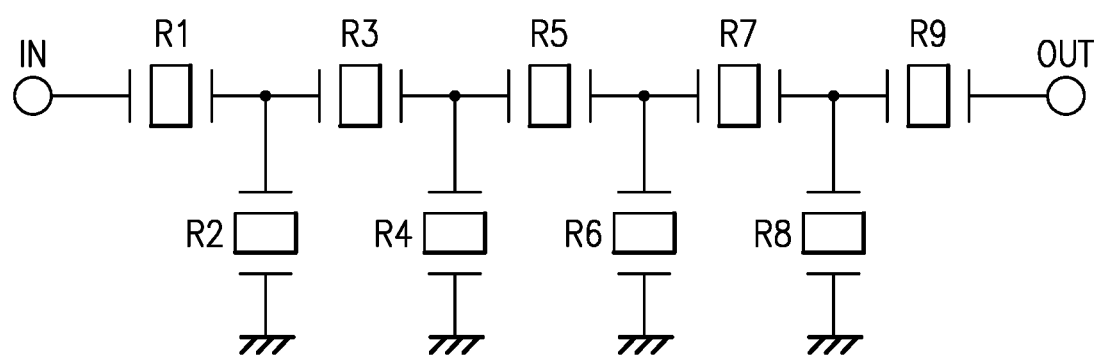
FIG. 15 is a schematic diagram of a radio frequency ladder filter.

In some embodiments, multiple SAW resonators as disclosed herein may be combined into a filter, for example, an RF ladder filter schematically illustrated in FIG. 15 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include SAW devices or resonators, for example, duplexers, baluns, etc., may also be formed including examples of SAW resonators as disclosed herein.

Figure 16:
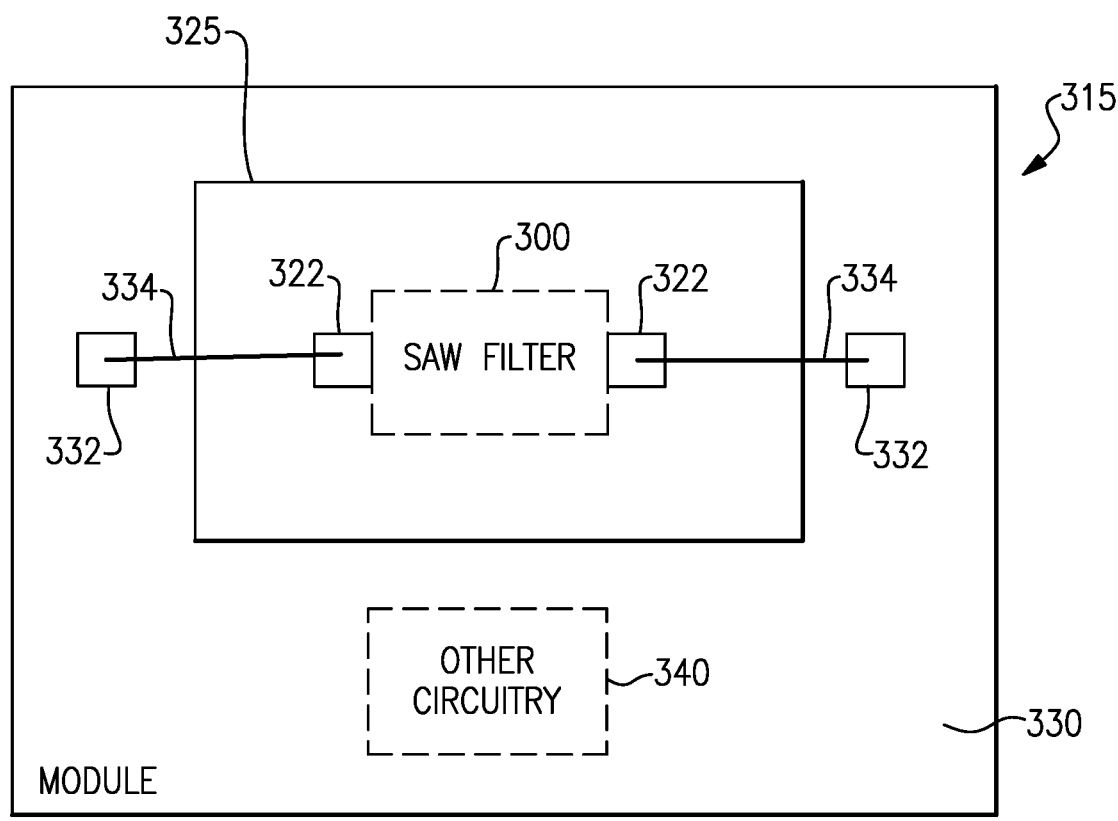
FIG. 16 is a block diagram of one example of a filter module that can include one or more acoustic wave elements according to aspects of the present disclosure.
Figure 17:
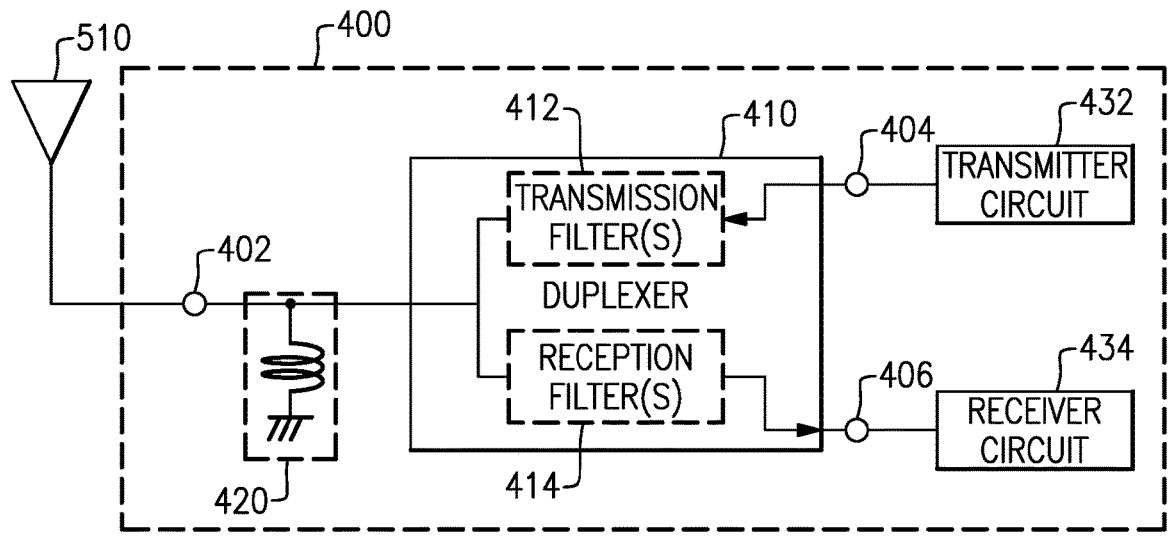
FIG. 17 is a block diagram of one example of a front-end module that can include one or more filter modules according to aspects of the present disclosure.
Figure 18:
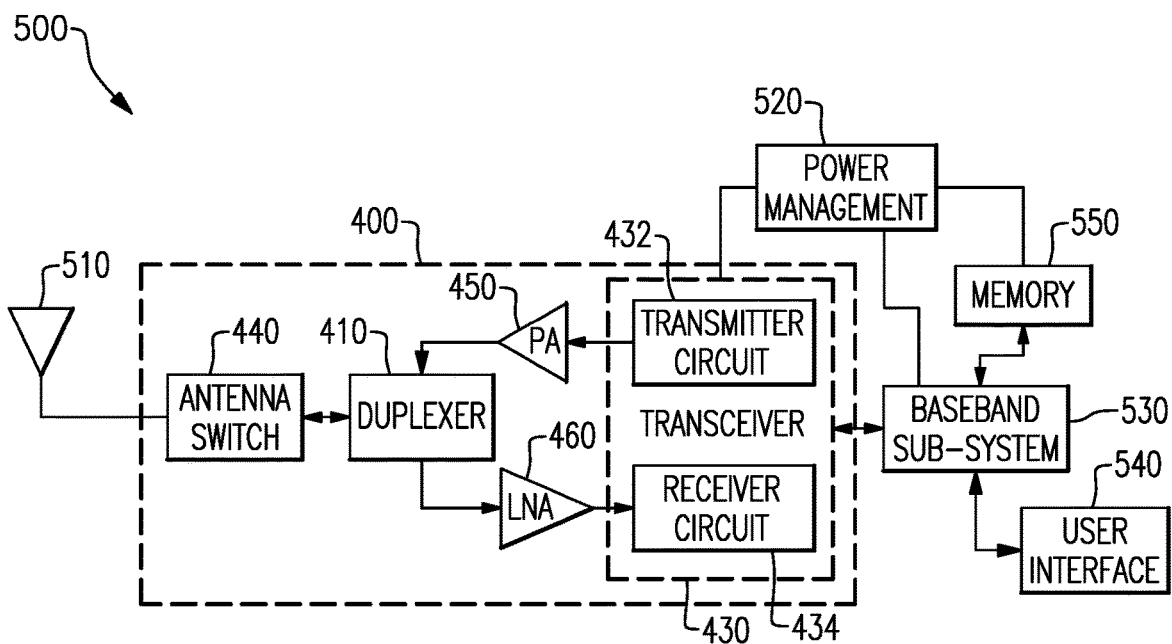
FIG. 18 is a block diagram of one example of a wireless device including the front-end module of FIG. 17.

Examples of the SAW devices, e.g., SAW resonators discussed herein can be implemented in a variety of packaged modules. Some example packaged modules will now be discussed in which any suitable principles and advantages of the SAW devices discussed herein can be implemented. FIGS. 16, 17, and 18 are schematic block diagrams of illustrative packaged modules and devices according to certain embodiments.

As discussed above, surface acoustic wave resonators can be used in surface acoustic wave (SAW) RF filters. In turn, a SAW RF filter using one or more surface acoustic wave elements may be incorporated into and packaged as a module that may ultimately be used in an electronic device, such as a wireless communications device, for example. FIG. 16 is a block diagram illustrating one example of a module 315 including a SAW filter 300. The SAW filter 300 may be implemented on one or more die(s) 325 including one or more connection pads 322. For example, the SAW filter 300 may include a connection pad 322 that corresponds to an input contact for the SAW filter and another connection pad 322 that corresponds to an output contact for the SAW filter. The packaged module 315 includes a packaging substrate 330 that is configured to receive a plurality of components, including the die 325. A plurality of connection pads 332 can be disposed on the packaging substrate 330, and the various connection pads 322 of the SAW filter die 325 can be connected to the connection pads 332 on the packaging substrate 330 via electrical connectors 334, which can be solder bumps or wirebonds, for example, to allow for passing of various signals to and from the SAW filter 300. The module 315 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 315 can also include one or more packaging structures to, for example, provide protection and facilitate easier handling of the module 315. Such a packaging structure can include an overmold formed over the packaging substrate 330 and dimensioned to substantially encapsulate the various circuits and components thereon.

Various examples and embodiments of the SAW filter 300 can be used in a wide variety of electronic devices. For example, the SAW filter 300 can be used in an antenna duplexer, which itself can be incorporated into a variety of electronic devices, such as RF front-end modules and communication devices.

Referring to FIG. 17, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filter 300 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 17, however, in other embodiments these components may be integrated into a common transceiver circuit or module. As will be appreciated by those skilled in the art, the front-end module 400 may include other components that are not illustrated in FIG. 17 including, but not limited to, switches, electromagnetic couplers, amplifiers, processors, and the like.

FIG. 18 is a block diagram of one example of a wireless device 500 including the antenna duplexer 410 shown in FIG. 17. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 17. The front-end module 400 includes the duplexer 410, as discussed above. In the example shown in FIG. 18 the front-end module 400 further includes an antenna switch 440, which can be configured to switch between different frequency bands or modes, such as transmit and receive modes, for example. In the example illustrated in FIG. 18, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 18.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 18, the front-end module 400 may further include a low noise amplifier module 460, which amplifies received signals from the antenna 510 and provides the amplified signals to the receiver circuit 434 of the transceiver 430.

The wireless device 500 of FIG. 18 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A surface acoustic wave resonator circuit comprising: a multilayer piezoelectric substrate including a layer of piezoelectric material having a lower surface bonded to an upper surface of a layer of a dielectric material, the dielectric material having a lower surface bonded to an upper surface of a carrier substrate;
a dual-mode surface acoustic wave (DMS) resonator including a plurality of pairs of interleaved interdigital transducer (IDT) electrodes disposed on the multilayer piezoelectric substrate between first and second reflector electrode structures, each pair of interleaved IDT electrodes including a signal IDT electrode and a grounded IDT electrode, IDT electrodes of each of the plurality of pairs of IDT electrodes of the DMS resonator including an upper layer and a lower layer, the upper layer formed of a material having a higher conductivity than the lower layer, the lower layer formed of a material having a higher density than the upper layer; and
a surface acoustic wave (SAW) resonator having an output electrically coupled to an input signal electrode of the DMS resonator, the SAW resonator including interleaved IDT electrodes disposed on the multilayer piezoelectric substrate between third and fourth reflector electrode structures, the IDT electrodes of the SAW resonator each including an upper layer and a lower layer, the upper layer formed of a material having a higher conductivity than the lower layer, the lower layer formed of a material having a higher density than the upper layer.

2. The surface acoustic wave resonator circuit of claim 1 wherein the upper layer of each of the IDT electrodes of the DMS resonator and each of the IDT electrodes of the SAW resonator includes aluminum and the lower layer of each of the IDT electrodes of the DMS resonator and each of the IDT electrodes of the SAW resonator includes one or more of molybdenum, tungsten, copper, gold, silver, platinum, ruthenium, or iridium.

3. The surface acoustic wave resonator circuit of claim 1 wherein the layer of piezoelectric material has a thickness of between about $0.1\lambda$ and about $1\lambda$, $\lambda$ being the wavelength of a main acoustic wave generated in the SAW resonator during operation.

4. The surface acoustic wave resonator circuit of claim 3 wherein the layer of dielectric material has a thickness of between about $0.01\lambda$ and about $1\lambda$.

5. The surface acoustic wave resonator circuit claim 4 wherein the upper layer of the IDT electrodes of the DMS resonator and the IDT electrodes of the SAW resonator have thicknesses of between about $0.04\lambda$ and about $0.1\lambda$.

6. The surface acoustic wave resonator circuit of claim 5 wherein the lower layer of the IDT electrodes of the DMS resonator and the IDT electrodes of the SAW resonator have thicknesses of between about $0.02\lambda$ and about $0.08\lambda$.

7. The surface acoustic wave resonator circuit of claim 1 wherein the reflector electrode structures of the DMS resonator and the reflector electrode structures of the SAW resonator each include reflector electrodes including an upper layer and a lower layer, the upper layer formed of the material having the higher conductivity than the lower layer, the lower layer formed of the material having the higher density than the upper layer.

8. The surface acoustic wave resonator circuit of claim 7 wherein a composition of the IDT electrodes and reflector electrodes of the SAW resonator provides for a width of the SAW resonator in a propagation direction of a main acoustic wave generated in the SAW resonator during operation to be reduced by about 30% relative to another SAW resonator producing a main acoustic wave with a same wavelength as the SAW resonator, but with IDT electrodes and reflector electrodes consisting of aluminum.

9. The surface acoustic wave resonator circuit of claim 1 further comprising a layer of dielectric disposed on an upper surface of the IDT electrodes of the DMS resonator, the IDT electrodes of the SAW resonator, and the piezoelectric substrate.

10. The surface acoustic wave resonator circuit of claim 9 wherein the layer of dielectric includes a layer of silicon dioxide, a layer of silicon oxynitride on the layer of silicon dioxide, and a layer of silicon nitride on the layer of silicon oxynitride.

11. The surface acoustic wave resonator circuit of claim 1 wherein the layer of dielectric material is a continuous layer.

12. The surface acoustic wave resonator circuit of claim 11 wherein the layer of dielectric material is bonded to the lower surface of the layer of piezoelectric material beneath entireties of the DMS and SAW resonators.

13. The surface acoustic wave resonator circuit of claim 1 wherein the carrier substrate is formed of a material having a lower coefficient of thermal expansion than the piezoelectric material.

14. The surface acoustic wave resonator circuit of claim 1 wherein the carrier substrate is formed of a material having a higher thermal conductivity than the piezoelectric material.

15. The surface acoustic wave resonator circuit of claim 1 wherein the carrier substrate is formed of a material selected from the group consisting of silicon, aluminum nitride, silicon nitride, magnesium oxide spinel, magnesium oxide crystal, and sapphire.

16. The surface acoustic wave resonator circuit of claim 1 wherein the upper layers of the IDT electrodes of the DMS resonator and the upper layers of the IDT electrodes of the SAW resonator are thicker than the lower layers of the IDT electrodes of the DMS resonator and the lower layers of the IDT electrodes of the SAW resonator.

17. The surface acoustic wave resonator circuit of claim 1 wherein a thickness of the dielectric material is less than a wavelength of a main acoustic wave generated in the SAW resonator during operation.

18. The surface acoustic wave resonator circuit of claim 1 wherein an acoustic velocity of a main acoustic wave generated in the SAW resonator during operation is less than about 3000 m/s.

19. An electronic module having at least one radio frequency filter comprising:
a multilayer piezoelectric substrate including a layer of piezoelectric material having a lower surface bonded to an upper surface of a layer of a dielectric material, the dielectric material having a lower surface bonded to an upper surface of a carrier substrate;
a dual-mode surface acoustic wave (DMS) resonator including a plurality of pairs of interleaved interdigital transducer (IDT) electrodes disposed on the multilayer piezoelectric substrate between first and second reflector electrode structures, each pair of interleaved IDT electrodes including a signal IDT electrode and a grounded IDT electrode, IDT electrodes of each of the plurality of pairs of IDT electrodes of the DMS resonator including an upper layer and a lower layer, the upper layer formed of a material having a higher conductivity than the lower layer, the lower layer formed of a material having a higher density than the upper layer; and
a surface acoustic wave (SAW) resonator having an output electrically coupled to an input signal electrode of the DMS resonator, the SAW resonator including interleaved IDT electrodes disposed on the multilayer piezoelectric substrate between third and fourth reflector electrode structures, the IDT electrodes of the SAW resonator each including an upper layer and a lower layer, the upper layer formed of a material having a higher conductivity than the lower layer, the lower layer formed of a material having a higher density than the upper layer.

20. An electronic device with an electronic module having at least one radio frequency filter comprising:
a multilayer piezoelectric substrate including a layer of piezoelectric material having a lower surface bonded to an upper surface of a layer of a dielectric material, the dielectric material having a lower surface bonded to an upper surface of a carrier substrate;
a dual-mode surface acoustic wave (DMS) resonator including a plurality of pairs of interleaved interdigital transducer (IDT) electrodes disposed on the multilayer piezoelectric substrate between first and second reflector electrode structures, each pair of interleaved IDT electrodes including a signal IDT electrode and a grounded IDT electrode, IDT electrodes of each of the plurality of pairs of IDT electrodes of the DMS resonator including an upper layer and a lower layer, the upper layer formed of a material having a higher conductivity than the lower layer, the lower layer formed of a material having a higher density than the upper layer; and
a surface acoustic wave (SAW) resonator having an output electrically coupled to an input signal electrode of the DMS resonator, the SAW resonator including interleaved IDT electrodes disposed on the multilayer piezoelectric substrate between third and fourth reflector electrode structures, the IDT electrodes of the SAW resonator each including an upper layer and a lower layer, the upper layer formed of a material having a higher conductivity than the lower layer, the lower layer formed of a material having a higher density than the upper layer.

* * * * *

UNITED STATES PATENT AND TRADEMARK OFFICE
CERTIFICATE OF CORRECTION

| | |
|---|---|
| PATENT NO. | : 11,722,122 B2 |
| APPLICATION NO. | : 17/093747 |
| DATED | : August 8, 2023 |
| INVENTOR(S) | : Rei Goto et al. |

It is certified that error appears in the above-identified patent and that said Letters Patent is hereby corrected as shown below:

On the Title Page

Item (72) Inventors: delete "Rei Goto, Osaka (JP); Gong Bin Tang, Moriguchi (JP); Keiichi Maki, Suita (JP)" and insert -- Rei Goto, Osaka-Shi (JP); Gong Bin Tang, Moriguchi-Shi (JP); Keiichi Maki, Suita-Shi (JP) --

Signed and Sealed this
Nineteenth Day of September, 2023

Katherine Kelly Vidal
*Director of the United States Patent and Trademark Office*